United States Patent
Ahn et al.

(10) Patent No.: US 7,638,788 B2
(45) Date of Patent: Dec. 29, 2009

(54) PHASE CHANGE MEMORY DEVICE AND METHOD OF FORMING THE SAME

(75) Inventors: Dong-Ho Ahn, Suwon-si (KR); Hideki Horii, Seoul (KR); Jong-Chan Shin, Seongnam-si (KR); Jun-Soo Bae, Hwaseong-si (KR); Hyeong-Geun An, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 108 days.

(21) Appl. No.: 11/974,774

(22) Filed: Oct. 16, 2007

(65) Prior Publication Data

US 2008/0093590 A1 Apr. 24, 2008

(30) Foreign Application Priority Data

Oct. 20, 2006 (KR) .................. 10-2006-0102569

(51) Int. Cl.
*H01L 29/04* (2006.01)

(52) U.S. Cl. .................. 257/3; 257/4; 257/289; 257/E29.276; 338/13; 365/100; 365/148; 438/197; 438/900

(58) Field of Classification Search .................. 365/100, 365/148; 257/1–8, 289, E29.276; 438/900, 438/197; 338/13
See application file for complete search history.

(56) References Cited

U.S. PATENT DOCUMENTS

| | | | |
|---|---|---|---|
| 6,744,088 B1 | 6/2004 | Dennison | |
| 6,815,704 B1 | 11/2004 | Chen | |
| 6,936,840 B2 | 8/2005 | Sun et al. | |
| 7,038,230 B2 | 5/2006 | Chen et al. | |
| 7,075,131 B2 | 7/2006 | Chen | |
| 2005/0110983 A1 | 5/2005 | Jeong et al. | |
| 2006/0024429 A1 | 2/2006 | Horii | |
| 2007/0170413 A1* | 7/2007 | Matsui et al. ................... 257/3 |
| 2008/0026535 A1* | 1/2008 | Yang et al. ................... 438/335 |

FOREIGN PATENT DOCUMENTS

| | | |
|---|---|---|
| KR | 1020040050115 | 1/2002 |
| KR | 1020050038422 A | 4/2005 |
| KR | 1020050049810 A | 5/2005 |
| KR | 1020040050123 | 1/2006 |
| KR | 1020060012182 A | 2/2006 |

* cited by examiner

*Primary Examiner*—Evan Pert
*Assistant Examiner*—Scott R Wilson
(74) *Attorney, Agent, or Firm*—Mills & Onello, LLP

(57) ABSTRACT

Provided are a phase change memory device and a method of forming the same. According to the phase change memory, a first plug electrode and a second plug electrode are spaced apart from each other in a mold insulating layer. A phase change pattern is disposed on the mold insulating layer. The phase change pattern contacts a top of the first plug electrode and a first potion of a top of the second plug electrode. An interconnection is electrically connected to a second portion of the top of the second plug electrode.

27 Claims, 8 Drawing Sheets

PHASE CHANGE MEMORY DEVICE AND METHOD OF FORMING THE SAME

CROSS-REFERENCE TO RELATED APPLICATIONS

This U.S. non-provisional patent application claims priority under 35 U.S.C. §119 to Korean Patent Application No. 10-2006-0102569, filed on Oct. 20, 2006, the entire contents of which are hereby incorporated by reference.

BACKGROUND OF THE INVENTION

The present invention disclosed herein relates to a semiconductor device and a method of forming the same, and more particularly, to a phase change memory device and a method of forming the same.

A state of a phase change material can change into a crystalline state or an amorphous state by varying a temperature of a supplied heat and/or a heat supplying time. That is, after supplying a higher temperature than a melting temperature into the phase change material, the phase change material is rapidly cooled down to change into an amorphous state. Unlike this, after supplying a lower temperature than a melting temperature into the phase change material, the phase change material is slowly cooled down to change into a crystalline state. A heat for changing a state of the phase change material is Joule's heat. Joule's heat is generated using the amount of an operation current that flows through the phase change material and/or the resistivity of electrodes connected to the phase change material. A state of the phase change material changes by adjusting a supplying time and a temperature of Joule's heat.

On the other hand, a phase change memory device with a metal pattern, which contacts the entire top surface of the phase change material, has been suggested. The metal pattern is used as one electrode contacting the phase change material. However, a metal in the metal pattern spreads into the phase change material such that characteristics of the phase change material can be changed. Accordingly, malfunction can occur in the phase change material. To resolve theses limitations, the phase change material can be thickly formed. However, if the phase change material is thick, a program region of the phase change material increases such that an amount of a current used in an erase and/or write operation increases. Accordingly, power consumption of the phase change memory device increases, and the phase change memory device cannot be easily integrated.

SUMMARY OF THE INVENTION

In accordance with one aspect of the present invention, there is provided a phase change memory device capable of minimizing character deterioration of a phase change memory, and a method of forming the same.

Also in accordance with the present invention, there is also provided a phase change memory device capable of minimizing pollution of the phase change material, and a method of forming the same.

Also in accordance with the present invention, there is provided a phase change memory device capable of reducing a volume of a program region in the phase change material, and a method of forming the same.

The phase change memory device has a non-volatile characteristic that retains stored data when no power is applied. The phase change memory device adopts a phase change material as a data storing medium. The phase change material includes two stable states, i.e., an amorphous state and a crystalline state. The phase change material in a crystalline state and the phase change material in an amorphous material have respectively different resistivities. Data of logic 1 and logic 0 can be stored and read using a difference between resistivity values.

In accordance with one aspect of the present invention, provided is a phase change memory device that includes: a mold insulating layer formed on a semiconductor substrate; a first plug electrode and a second plug electrode disposed in the mold insulating layer and spaced apart from each other; a phase change pattern disposed on the mold insulating layer and contacting a top of the first plug electrode and a first potion of a top of the second plug electrode; a top insulating layer covering an entire surface of the semiconductor substrate; an interconnection-plug penetrating the top insulating layer to connect to a second portion of the top of the second plug electrode; and an interconnection disposed on the top insulating layer and connected to the interconnection-plug.

A contact area between the second plug electrode and the phase change pattern can be broader than a contact area between the first plug electrode and the phase change pattern, and a program region can include a portion of the phase change pattern that contacts the first plug electrode.

The device can further include: a capping insulating pattern disposed on the phase change pattern; and an insulating spacer formed on sidewalls of the capping insulating pattern and the phase change pattern.

The interconnection-plug can contact the insulating spacer.

The phase change pattern can have a linear form that extends in one direction, and the interconnection can extend along the one direction such that it is parallel to the phase change pattern.

A bottom of the first plug electrode can be connected to a switching device disposed below the mold insulating layer, and a bottom of the second plug electrode can contact an insulating material.

The device can further include: a dopant doped line formed at an active region that is formed on the semiconductor substrate; a bottom insulating layer disposed over the entire surface of the semiconductor substrate; and a PN diode filling an opening, the opening penetrating the bottom insulating layer to expose the dopant doped line. A bottom of the first plug electrode can contact a top of the PN diode, and a bottom of the second plug electrode can contact the bottom insulating layer.

The phase change pattern and the interconnection can cross over the dopant doped line side-by-side.

The device can further comprise a hole spacer interposed between the first plug electrode and a sidewall of a first electrode hole, and between the second plug electrode and a sidewall of a second electrode hole, wherein the first and second plug electrodes can be disposed in the first and second electrode holes, respectively, and the first and second electrode holes penetrate the mold insulating layer.

In accordance with another aspect of the present invention, a phase change memory device can include: a mold insulating layer formed on a semiconductor substrate; a pair of first plug electrodes spaced apart from each other in the mold insulating layer; a second plug electrode disposed in the mold insulating layer, at least a portion of the second plug electrode disposed between the pair of first plug electrodes; a phase change pattern disposed on the mold insulating layer and contacting tops of the pair of first plug electrodes and a first portion of a top of the second plug electrode; a top insulating layer disposed over an entire surface of the semiconductor substrate; an interconnection-plug penetrating the top insulating layer to connect to a second portion of the top of the second plug electrode; and an interconnection disposed on the top insulating layer and connected to the interconnection-plug.

A contact area between the second plug electrode and the phase change pattern can be broader than a contact area between a first plug electrode from the pair of first plug electrodes and the phase change pattern, and a program region can comprise a portion of the phase change pattern, which contacts the first plug electrode.

The device can further comprise: a capping insulating pattern disposed on the phase change pattern; and an insulating spacer formed on sidewalls of the capping insulating pattern and the phase change pattern.

A bottom of the first plug electrode can be connected to a switching device disposed below the mold insulating layer, and a bottom of the second plug electrode can contact an insulating material.

The device can further comprise: a dopant doped line formed at an active region that is formed on the semiconductor substrate; a bottom insulating layer on the entire surface of the semiconductor substrate; and a PN diode filling an opening, the opening penetrating the bottom insulating layer to expose the dopant doped line. The bottom of the first plug electrode can contact a top of the PN diode; a bottom of the second plug electrode can contact the bottom insulating layer; and the phase change pattern and the interconnection cross over the dopant doped line side-by-side.

The pair of first plug electrodes can be included in a pair of unit cells, respectively, wherein the pair of unit cells can share the second plug electrode and the pair of unit cells can be arranged along one direction.

The device can comprises a plurality of pairs of first plug electrodes arranged along one direction and a plurality of the second electrodes arranged along the one direction, wherein the first electrodes can be arranged with equal intervals therebetween, and a portion of each of the second electrodes can be disposed between adjacent first electrodes.

In accordance with another aspect of the present invention, a method of forming a phase change memory device is provided. The method includes: forming a mold insulating layer on a semiconductor substrate; forming a first plug electrode and a second plug electrode spaced apart from each other in the mold insulating layer; forming a phase change pattern on the mold insulating layer, the phase change pattern contacting a top of the first plug electrode and a first potion of a top of the second plug electrode; forming a top insulating layer covering the semiconductor substrate; forming an interconnection-plug penetrating the top insulating layer to connect to a second portion of the top of the second plug electrode; and forming an interconnection on the top insulating layer, the interconnection connected to the interconnection-plug.

A contact area between the second plug electrode and the phase change pattern can be broader than a contact area between the first plug electrode and the phase change pattern, and a program region can comprise a portion of the phase change pattern that contacts the first plug electrode.

The method can further comprise, before the forming of the top insulating layer: forming a capping insulating pattern on the phase change pattern; and forming an insulating spacer on sidewalls of the capping insulating pattern and the phase change pattern.

Forming the interconnection-plug can include self-aligning the interconnection-plug to the insulating spacer.

The method can further comprise, before the forming of the mold insulating layer: forming a switching device on the semiconductor substrate, including connecting a bottom of the first plug electrode to the switching device below the mold insulating layer, and contacting a bottom of the second plug electrode to an insulating material.

The method can further comprise: forming a device isolation layer to define an active region on the semiconductor substrate; forming a dopant doped line at the active region; forming a bottom insulating on the semiconductor substrate; patterning the bottom insulating layer to form an opening that exposes the dopant doped line; and forming a PN diode that fills the opening, wherein the bottom of the first plug electrode contacts a top of the PN diode; the bottom of the second plug electrode contacts the bottom insulating layer; and the interconnection and the phase change pattern crosses over the dopant doped line.

At least a lower portion of the mold insulating layer can have an etch selectivity with respect to the bottom insulating layer.

Forming of the first and second plug electrodes can comprise: patterning the mold insulating layer to form a first electrode hole and a second electrode hole that are spaced apart from each other; forming a hole spacer on sidewalls of the first and second electrode holes; forming a conductive layer to fill the first and second electrode holes having the hole spacer; and planarizing the conductive layer, until the mold insulating layer is exposed, to form the first and second plug electrodes.

At least an upper portion of the mold insulating layer can have an etch selectivity with respect to the top insulating layer.

BRIEF DESCRIPTION OF THE FIGURES

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention. In the figures.

DETAILED DESCRIPTION OF PREFERRED EMBODIMENTS

Figure 1:
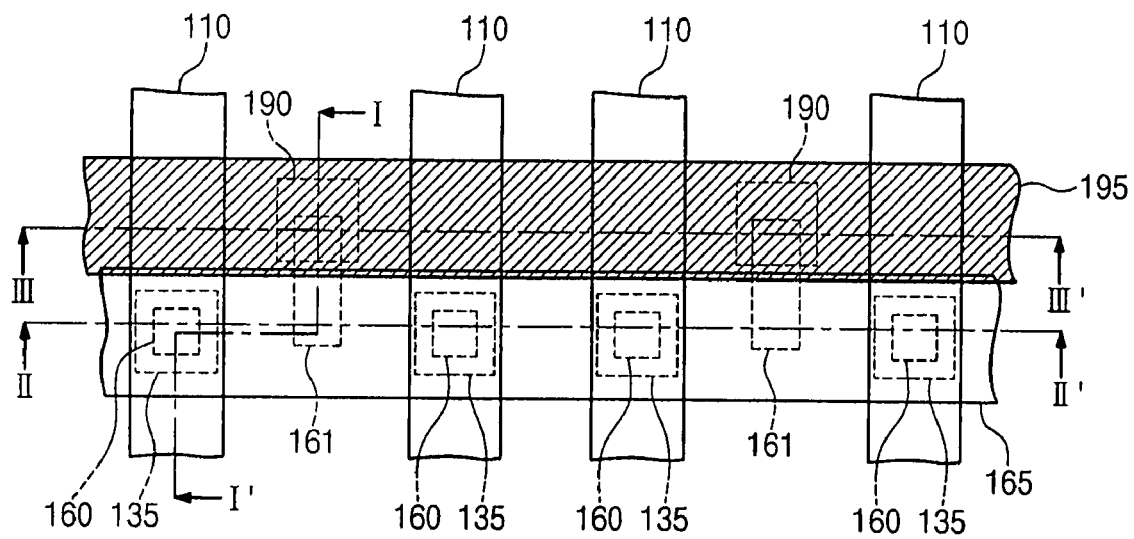
FIG. 1 is a plan view of an embodiment of a phase change memory device according to one aspect of the present invention.

Hereinafter, aspects of the present invention will be described by explaining illustrative embodiments below in more detail with reference to the accompanying drawings. The present invention can, however, be embodied in different forms and should not be construted as limited to the embodiments set forth herein.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

In the figures, the dimensions of layers and regions are exaggerated for clarity of illustration. It will also be understood that when a layer (or film) is referred to as being 'on' or 'over' another layer or substrate, it can be directly on or over the other layer or substrate, or intervening layers can also be present. Further, it will be understood that when a layer is referred to as being 'under' another layer, it can be directly under, and one or more intervening layers can also be present. In addition, it will also be understood that when a layer is referred to as being 'between' two layers, it can be the only layer between the two layers, or one or more intervening layers can also be present. Like reference numerals refer to like elements throughout.

Hereinafter, it will be described about an exemplary embodiment of the present invention in conjunction with the accompanying drawings.

Figure 2A:
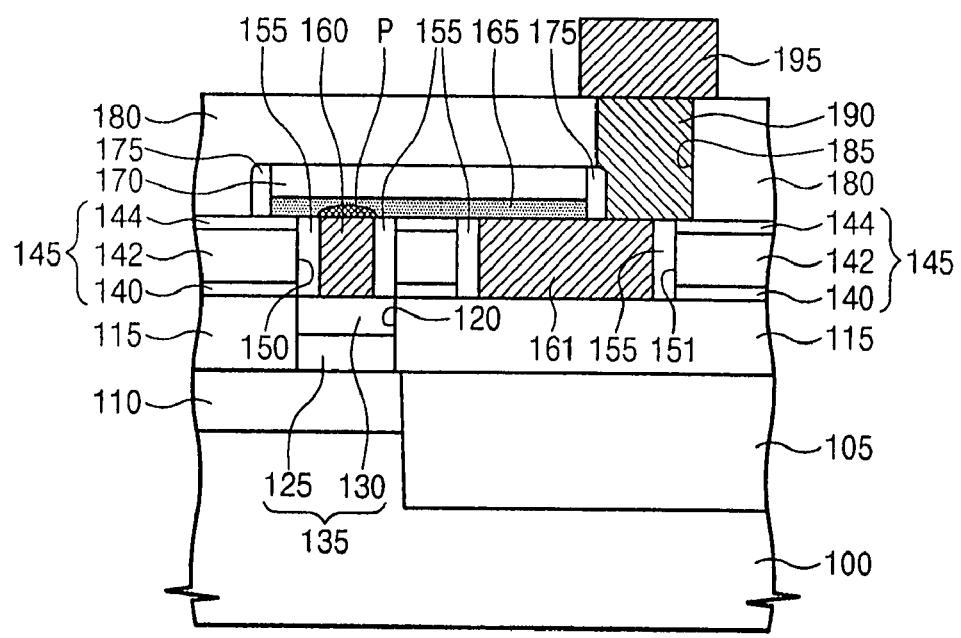
FIGS. 2a, 2b, and 2c are sectional views taken along lines of I-I', II-II', and III-III' of FIG. 1, respectively.
Figure 2B:
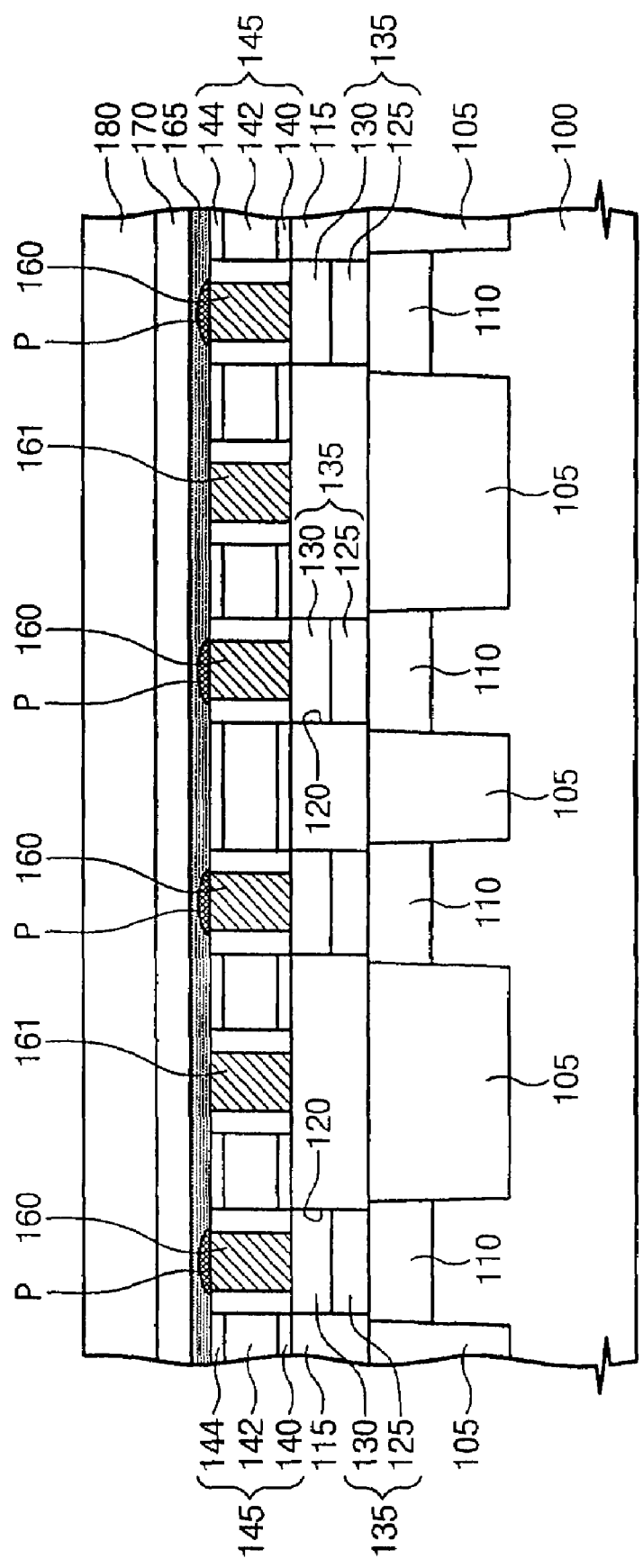
Figure 2C:
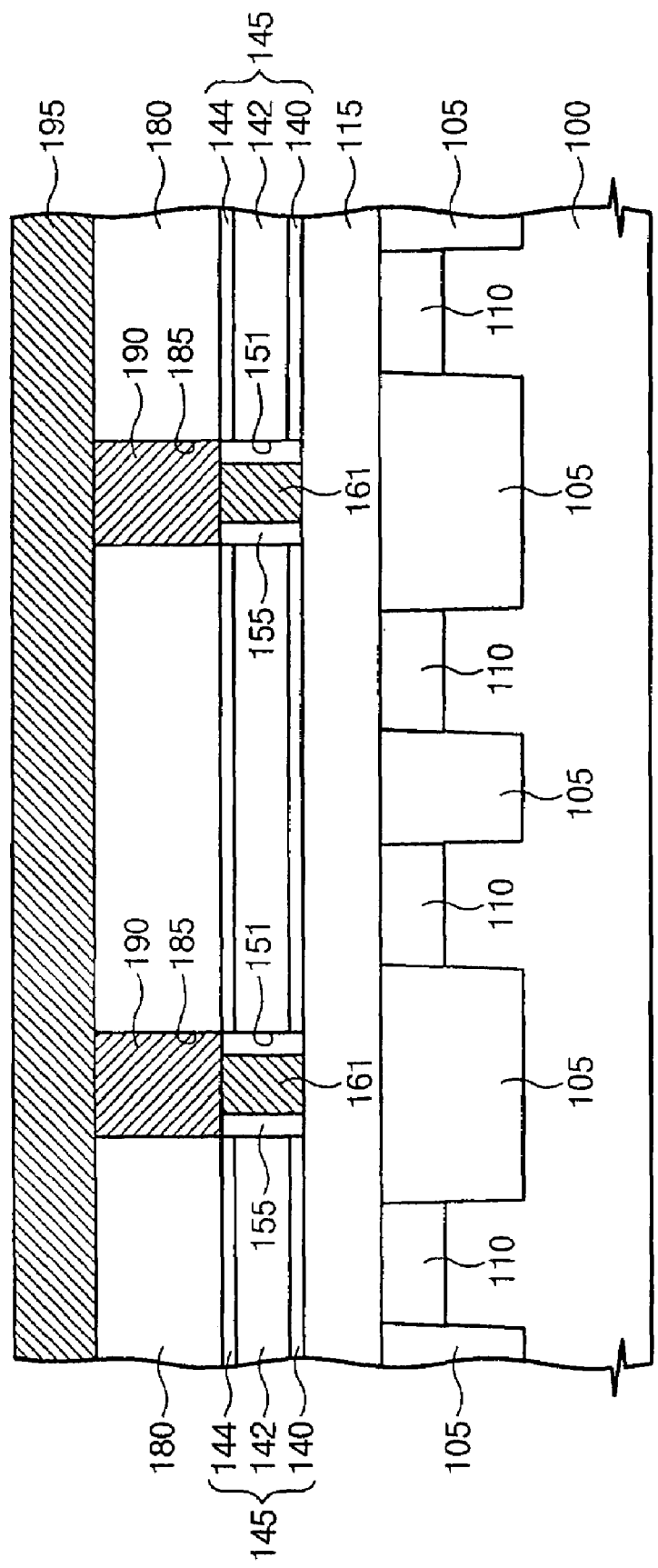

FIG. 1 is a plan view of an embodiment of a phase change memory device according to one aspect of the present invention. FIGS. 2a, 2b, and 2c are sectional views taken along lines of I-I', II-II', and III-III' of FIG. 1, respectively.

Referring to FIGS. 1, 2a, 2b, and 2c, a device isolation layer 105 is disposed on a semiconductor substrate 100 to define a plurality of active regions. The active regions extend along a first direction side-by-side. The active regions are doped with a first conductive type dopant. A dopant doped line 110 is disposed at the active region. The dopant doped line 110 is doped with a second conductive type dopant. The dopant doped line 110 is a straight line extending along the active region and the first direction, in this embodiment. A plurality of dopant doped lines 110 are formed at the plurality of active regions on substrate 100, respectively.

A bottom insulating layer 115 covers the entire surface of the semiconductor substrate 100. The bottom insulating layer 115 can be formed of oxide. A PN diode 135, i.e., a switching device, is disposed in an opening 120 that penetrates through the bottom insulating layer 115. A plurality of PN diodes 135 are disposed on the plurality of dopant doped lines 110, respectively, along a second direction that is perpendicular to the first direction. The PN diode 135 includes a first terminal layer 125 and a second terminal layer 130, which are sequentially stacked. The first and second terminal layers 125 and 130 are formed of semiconductor materials doped with dopants. The first terminal layer 125 is connected to the dopant doped line 110. The first terminal layer 125 is doped with dopants of an identical type with that of the dopant doped line 110. That is, the first terminal layer 125 is doped with the second conductive type dopants. Accordingly, the first terminal layer 125 is electrically connected to the dopant doped line 110. The second terminal layer 130 is doped with dopants of different types from that of the first terminal layer 125. That is, the second terminal layer 130 is doped with the first conductive type dopants. Accordingly, the first and second terminal layers 125 and 130 form a PN-junction for the PN diode 135. The top of the PN diode 135 (i.e., the top of the second terminal layer 130) can be coplanar with the top of the bottom insulating layer 115. It can be that the first conductive type dopant is a p-type dopant and the second conductive type dopant is an n-type dopant. In another embodiment, the first conductive type dopant is an n-type dopant, and the second conductive type dopant is a p-type dopant.

A mold insulating layer 145 is formed over the entire surface of the semiconductor substrate 100. A first plug electrode 160 and a second plug electrode 161, which are spaced apart from each other, are formed in the mold insulating layer 145. The bottom of the first plug electrode 160 contacts the top of the PN diode 135. A plurality of first plug electrodes 160 are connected to the plurality of PN diodes 135, respectively. Accordingly, the plurality of first plug electrodes 160 are arranged along the second direction. At least a portion of the second plug electrode 161 is disposed between a pair of adjacent first plug electrodes 160. The top of the second plug electrode 161 can have a rectangular form having a major axis parallel to the first direction. The top of each of the first plug electrodes 160 can also have a rectangular form. The bottom of the second plug electrode 161 can contact an insulating material. Specifically, the second plug electrode 161 can contact the bottom insulating layer 115, as illustrated in the drawings.

In this embodiment, a dual cell group includes a second plug electrode 161 disposed between a pair of the first plug electrodes 160. A plurality of dual cell groups is repeatedly arranged along the second direction. As illustrated in the drawings, a second plug electrode 161 is not disposed between two adjacent dual cell groups.

The first plug electrode 160 is disposed in a first electrode hole 150 within the mold insulating layer 145, and the second plug electrode 160 is disposed in a second electrode hole 151 within the mold insulating layer 145. A hole spacer 155 is disposed between the first plug electrode 160 and a sidewall of the first electrode hole 150, and between the second plug electrode 161 and a sidewall of a second electrode hole 151. Due to the hole spacer 155, the width of the first plug electrode 160 can be smaller than the width that can be defined by a photolithography process.

The mold insulating layer 145 includes a first layer 140, a second layer 142, and a third layer 144, which are sequentially stacked. The first layer 140 is formed of an insulating material having an etch selectivity with respect to the bottom insulating layer 115. For example, the first layer 140 can be formed of a nitride layer or an oxide nitride layer. The second layer 142 can be formed of an oxide layer. In other embodiments, the entire mold insulating layer 145 can be formed of an insulating material having an etch selectivity with respect to the bottom insulating layer 115.

The first and second plug electrodes 160 and 161 can include at least one material selected from the group comprising a conductive metal nitride, a conductive metal oxide nitride, a metal, and conductive carbon compounds. For example, the first and second plug electrodes can include at least one material selected from a group comprising TiN, TaN, WN, MoN, NbN, TiSiN, TiAlN, TiBN, ZrSiN, WSiN, WBN, ZrAlN, MoSiN, MoAlN, TaSiN, TaAlN, Ti, W, Mo, Ta, TiSi, TaSi, TiON, TiAlON, WON, TaON and conductive carbon compounds.

A phase change pattern 165 and a capping insulating pattern 170 are sequentially stacked on the mold insulating layer 145. As illustrated in the drawings, the phase change pattern 165 and the capping insulating pattern 170 extend along the second direction, and can be a straight line that crosses over the plurality of dopant doped lines s 110. In this case, the phase change pattern 165 contacts the top of the plurality of first plug electrodes 160, which is arranged along the second direction. The entire top of each of the first plug electrode 160 can contact the phase change pattern 165. Additionally, the phase change pattern 165 contacts a first portion of the top of the second plug electrode 161. At this point, a contact area between the second plug electrode 161 and the phase change pattern 165 can be broader than a contact area between the first plug electrode 160 and the phase change pattern 165. Accordingly, a resistance between the first plug electrode 160 and the phase change pattern 165 is higher than a resistance between the second plug electrode 161 and the phase change pattern 165. Consequently, a program region P in the phase change pattern 165 is defined on a portion that contacts the first plug electrode 160. That is, the program region P covers a contact area between the first plug electrode 160 and the phase change pattern 165.

The program region P is a region that changes into an amorphous state or a crystalline state during erase and write operations. An insulating spacer 175 can be formed on the sidewalls of the phase change pattern 165 and the capping insulating pattern 170. The top and sidewalls of the phase change pattern 165 are protected by the capping insulating pattern 170 and the insulating spacer 175, which are formed of an insulating material. Accordingly, heat loss can be minimized during a write or erase operation.

The phase change pattern 165 can have various forms. That is, the phase change pattern 165 can have an isolated rectangular form that contacts a pair of the first plug electrodes 160 and the second plug electrode 161 in the dual cell group. In this case, the plurality of phase change patterns 165 disposed in the dual cell groups, respectively, are spaced apart from each other along the second direction. That is, only the pair of unit cells can share one phase change pattern 165.

In other embodiments, the phase change pattern 165 can be disposed in one unit cell. In this case, the unit cell includes the one PN diode 135, the one first plug electrode 160, one second plug electrode 161, and the one phase change pattern 165. A pair of adjacent unit cells includes the phase change patterns 165, respectively. That is, in this case, the unit cells do not share the above components 135, 160, 161, and 165.

The phase change pattern 165 can be formed of a material layer including at least one material selected from a group comprising Te and Se in chalcogenide elements. For example, the phase change material pattern 170 can be formed of Ge—Sb—Te, As—Sb—Te, As—Ge—Sb—Te, Sn—Sb—Te, Ag—In—Sb—Te, In—Sb—Te, 5A group elements-Sb—Te, 6A group elements-Sb—Te, 6A group elements-Sb—Se, Ge—Sb, In—Sb, and doped Ge—Sb—Te. The doped Ge—Sb—Te can be doped with C, N, B, Bi, Si, P, Al, Dy or Ti. The capping insulating pattern 170 and the insulating spacer 175 can be formed of an insulating material that can protect the phase change pattern 165.

A top insulating layer 180 covers an entire surface of the semiconductor substrate 100. The top insulating layer 180 can be formed of an oxide layer. The third layer 144 of the mold insulating layer 145 can be formed of an insulating material having an etch selectivity with respect to the top insulating layer 180. For example, the third layer 144 can be formed of a nitride layer or an oxide nitride layer. The capping insulating pattern 170 and the insulating spacer 175 include the above functions (minimizing heat loss and protecting the phase change pattern 165) and an etch selectivity with respect to the top insulating layer 180. For example, the capping insulating pattern 170 and the insulating spacer 175 can be formed of a nitride layer or an oxide nitride layer.

An interconnection-plug 190 fills an interconnection contact hole 185 that passes through the top insulating layer 180. The interconnection-plug 190 contacts a second portion in the top of the second plug electrode 161, which is disposed on one side of the phase change pattern 165. Accordingly, the interconnection-plug 190 is disposed on one side of the phase change pattern 165. The interconnection-plug 190 can contact the insulating spacer 175. That is, the contact hole 185 can be self-aligned to the insulating spacer 175. A plurality of interconnection-plugs 190 contact a plurality of second plug electrodes 161, respectively. The interconnection-plugs 190 are arranged along the second direction. The interconnection-plug 190 is formed of a conductive material. Specifically, the interconnection-plug 190 can include a metal having a low resistivity such as W, Al, and Cu.

An interconnection 195 is disposed on the top insulating layer 180. The interconnection 195 extends toward the second direction, and contacts the interconnection-plugs 190 arranged along the second direction. The interconnection 195 is parallel to the phase change pattern 165, and crosses over the dopant doped lines 110. The interconnection 195 is disposed on one side of the phase change pattern 165. The edge of the interconnection 195 can overlap with the edge of the phase change pattern 165. The interconnection 195 can be formed of a conductive material. Especially, the interconnection 195 can include a metal including a low resistivity, such as W, Al, or Cu.

The dual cell group includes a pair of the first plug electrodes 160, with a pair of corresponding PN diodes 135 respectively connected to each of the first plug electrodes, a second plug electrode 161 disposed between the first plug electrodes 160, and a phase change pattern 165 connected to the first plug electrodes 160 and the second plug electrode 161. The dual cell group includes a pair of adjacent unit cells. As described above, the dual cell groups are repeatedly arranged along the second direction. A plurality of dual cell groups arranged along the second direction shares the phase change pattern 165 and the interconnection 195. The plurality of interconnections 195 can be arranged in parallel on the semiconductor substrate 100. That is, the unit cells can be 2-dimensionally arranged along a column direction (the first direction) and a row direction (the second direction).

The dopant doped line 110 corresponds to a word line, and the interconnection 195 corresponds to a bit line. In other embodiments, the dopant doped line 110 can be used as a bit line and the interconnection 195 can be used as a word line.

A current and/or voltage drop path of the unit cell includes the dopant doped line 110, the PN diode 135, the first plug electrode 160, the first phase change pattern 165, the second plug electrode 161, the interconnection-plug 190, and the interconnection 195. At this point, the current flows from the dopant doped line 110 toward the interconnection 195. But in other instances, the current can flow from the interconnection 195 toward the dopant doped line 110.

During write, erase and/or sense operations of the phase change memory device of the above structure, the dopant doped line 110 and the interconnection 195, which are connected to the selected unit cell, are selected. A first voltage and a second voltage are applied to the selected dopant doped line 110 and the interconnection 195, respectively. At this point, the first and second voltages are adjusted to apply a forward bias at the PN diode 135. During the write, erase, and/or sense operations, a voltage identical with the second voltage can be applied to unselected dopant doped lines 110 connected to the selected interconnection 195. In other embodiments, a reverse bias can be applied to the PN diode 135 connected to the unselected dopant lines 110 connected to the selected interconnection 195. Therefore, a voltage and/or a current for erase and sense operations can be supplied to only a selected cell.

According to the phase change memory device of this embodiment, a typical metal pattern does not exist on the top of the phase change pattern 165. Accordingly, the character deterioration of the phase change pattern 165, which is caused by a typical metal pattern, can be prevented. Consequently, the volume of the program region P can be reduced by thinning a thickness of the phase change pattern 165. Therefore, power consumption of the phase change memory device can be reduced and the high degree of integration can be achieved.

Additionally, the capping insulating pattern 170, i.e., an insulating material, is disposed on the top of the phase change pattern 110. Accordingly, heat loss occurring during erase and write operations can be minimized. Furthermore, the insulating spacer 175 covers the sidewall of the phase change pattern 110, thereby further reducing heat loss. Consequently, power consumption of the phase change memory device can be further reduced.

According to the phase change memory device, the PN diode 135 is used as the switching device. In other embodiments, the switching device can be a field effect transistor. In this case, the first plug electrode 160 is connected to source/drain regions of the transistors, and a gate of the transistor corresponds to a word line.

Figure 3A:
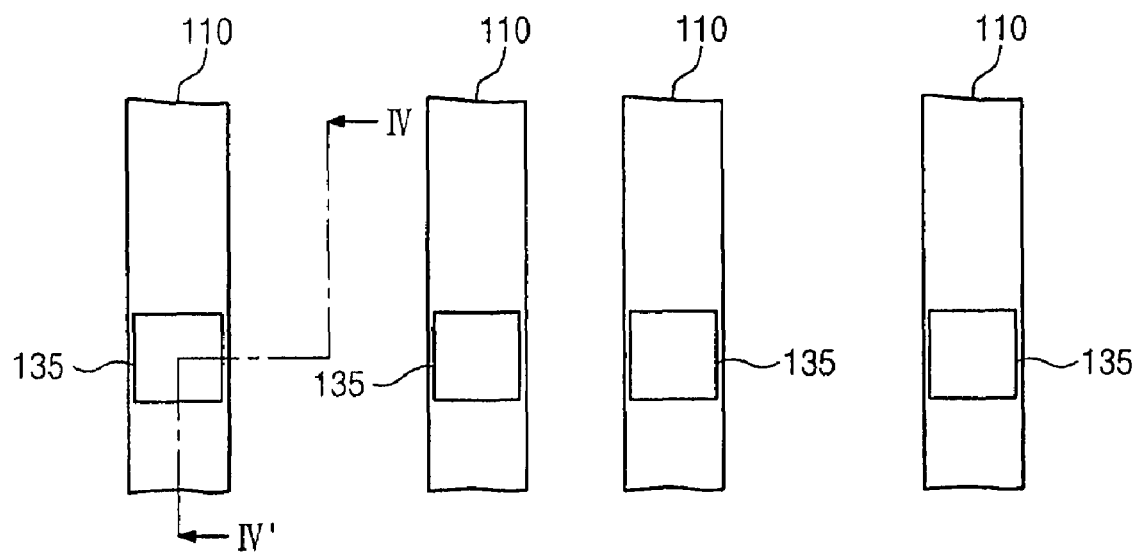
FIGS. 3a, 4a, and 5a are plan views illustrating an embodiment of a method of forming a phase change memory device according to another aspect of the present invention.
Figure 3B:
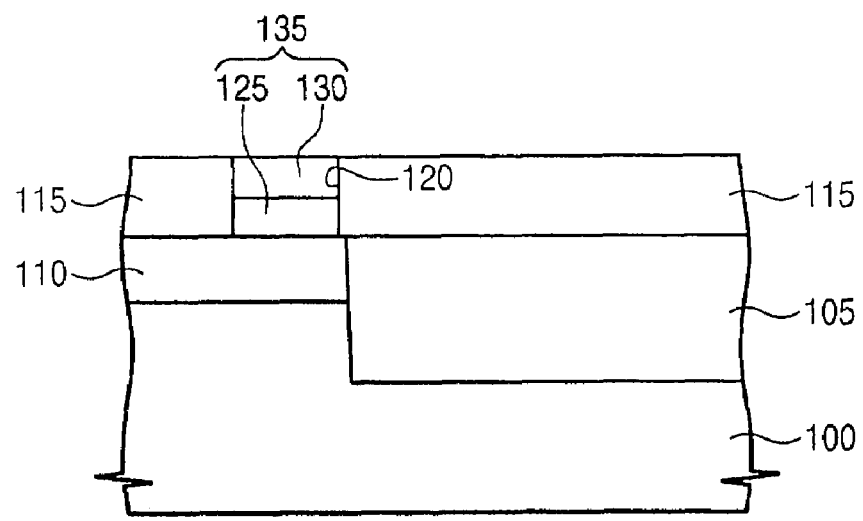
FIGS. 3b, 4b, and 5b are sectional views taken along lines of IV-IV' of FIGS. 3a, 4a, and 5a, respectively.
Figure 4A:
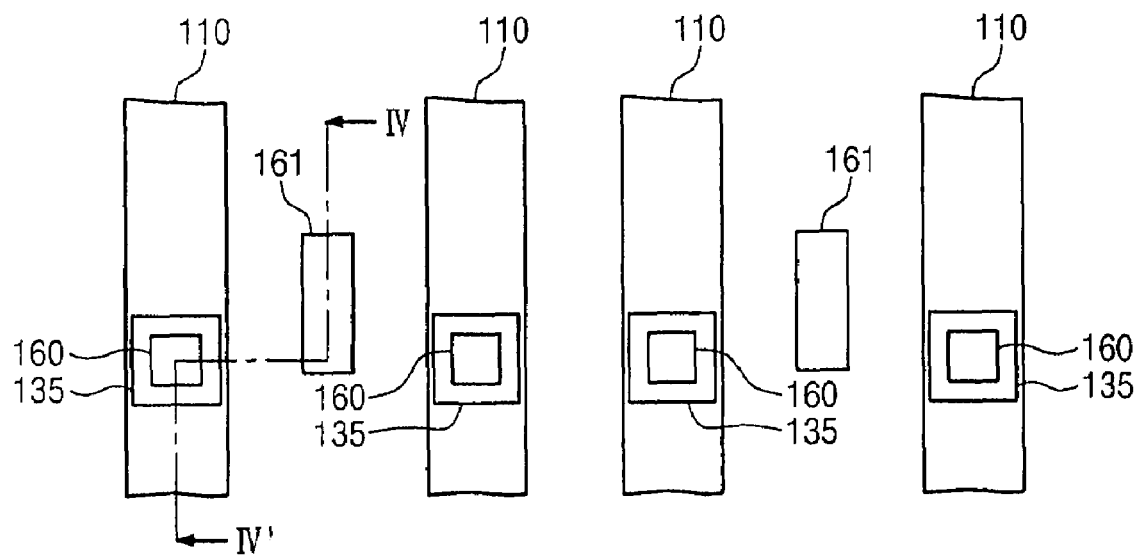
Figure 4B:
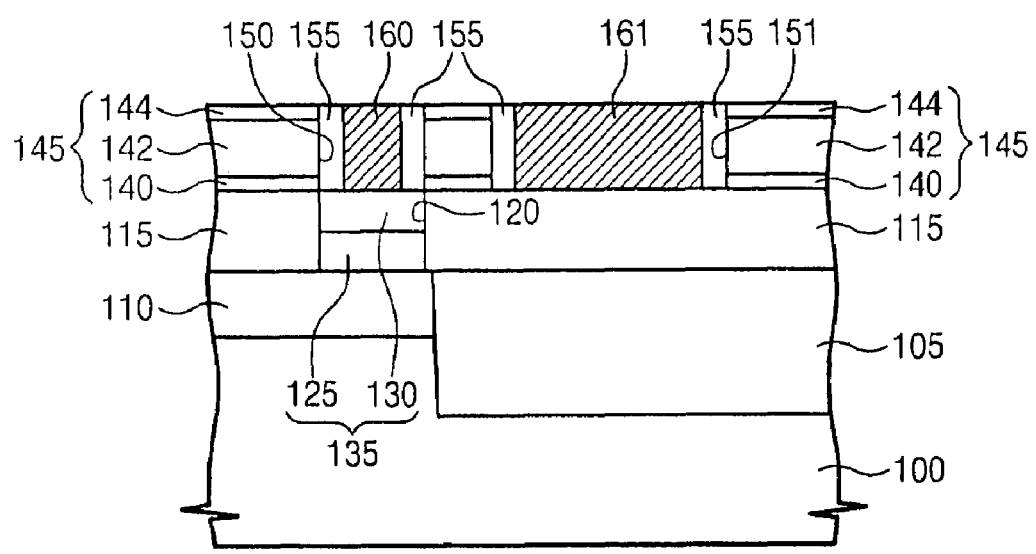
Figure 5A:
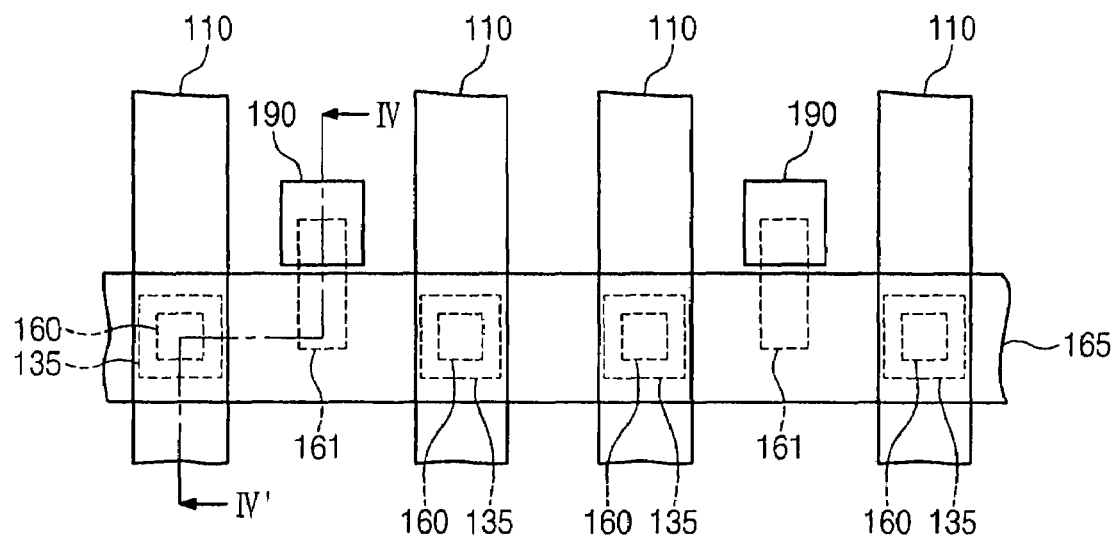
Figure 5B:
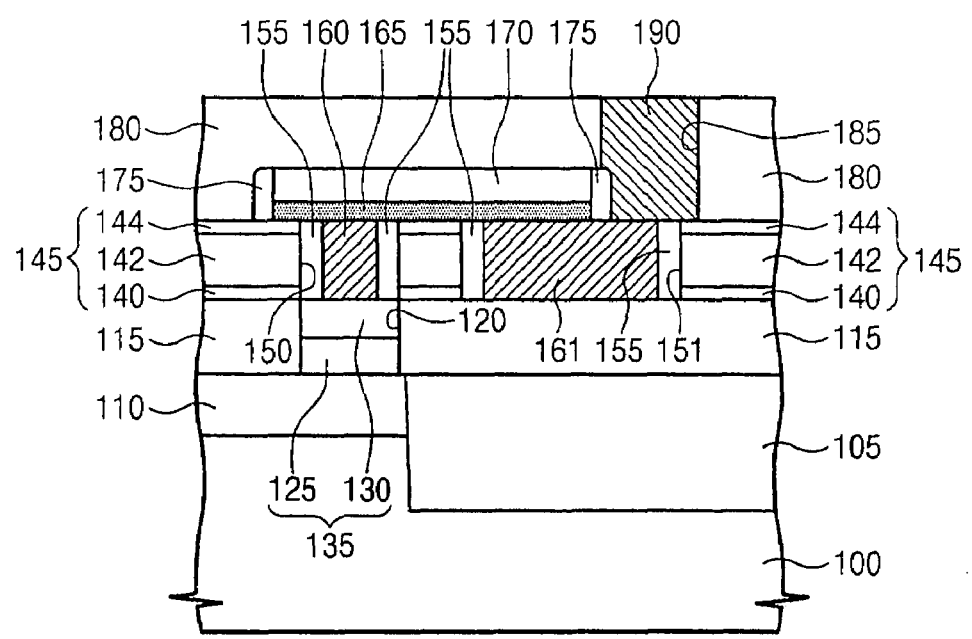

FIGS. 3a, 4a, and 5a are plan views illustrating an embodiment of a method of forming a phase change memory device according to an aspect of the present invention. FIGS. 3b, 4b, and 5b are sectional views taken along lines of IV-IV' of FIGS. 3a, 4a, and 5a, respectively.

Referring to FIGS. 3a and 3b, a device isolation layer 105 is formed on a semiconductor substrate 100 to define a plurality of active regions. The active regions extend side-by-side in a first direction. The active regions are doped with a first conductive dopant. The active regions can be doped with the first conductive type dopant by using a well forming process, for example.

Second conductive type ions are implanted on the active regions to form the dopant doped lines 110. Next, the bottom insulating layer 115 is formed over the entire surface of the semiconductor substrate 100.

The bottom insulating layer 115 is patterned to form an opening 120 exposing a region of the dopant doping lines 110. A plurality of openings 120 is formed on the bottom insulating layer 115 to respectively expose the region of dopant doping lines 110. The opening 120 is arranged along the second direction perpendicular to the first direction.

PN diodes 135 are formed to fill the openings 120. Each PN diode 135 includes a first terminal layer 125 and a second terminal layer 130, which are sequentially stacked. The first terminal layer 125 is formed of a semiconductor material doped with a second conductive type dopant, and the second terminal layer 130 is formed of a semiconductor material doped with a first conductive type dopant.

One method of forming the PN diode 135 will be described, as an illustrative example. First, a selective epitaxial growth process is performed by using the region of the dopant doped line 110 exposed by the opening 120 as a seed, such that an epitaxial layer is formed to fill the opening 120. Next, the top of the epitaxial layer is made to be coplanar with the top of the bottom insulating layer 115 by using a planarization process. Second conductive type dopant ions are implanted into the bottom of the planarized epitaxial layer to form the first terminal layer 125, and first conductive type dopant ions are implanted into the top of the planarized epitaxial layer to form the second terminal layer 130. As an alternative to the above ion implantation method, the second conductive type dopant and the first conductive type dopant can be sequentially doped in-situ during the selective epitaxial growth operation.

Another method of forming the PN diode 135 will now be described. A semiconductor layer filling the opening 120 is deposited over the semiconductor substrate 100, and on the bottom insulating layer 115. At this point, the semiconductor layer can be in an un-doped state. The semiconductor layer can be polysilicon, for example. Next, the semiconductor layer is planarized until the bottom insulating layer 115 is exposed such that a semiconductor pattern is formed to fill the opening 120. The second conductive type ions are implanted in a lower portion of the semiconductor pattern to from a first terminal layer 125, and the first conductive type ions are implanted in an upper portion of the semiconductor pattern to from a second terminal layer 125.

Referring to FIGS. 4a and 4b, a mold insulating layer 145 is formed over the entire surface of the semiconductor substrate 100. The mold insulating layer 145 can include a 18' first layer 140, a second layer 142, and a third layer 144, which are sequentially stacked. The first layer 140 is formed of an insulating material having an etch selectivity with respect to the bottom insulating layer 115. In other embodiments, the entire mold insulating layer 145 can be formed of a single layer that includes an insulating material having an etch selectivity with respect to the bottom insulating layer 115.

The mold insulating layer 145 is patterned to form a first electrode hole 150 and a second electrode hole 151, which are spaced apart from each other. The first electrode hole 150 exposes the top of the PN diode 135 and the second electrode hole 151 exposes the bottom insulating layer 115. When patterning the mold insulating layer 145, the first layer 115 can be used an etch stop layer. Accordingly, an increasing depth due to over etching can be prevented in the second electrode hole 151. The positions and arrangements of the first and second electrodes 150 and 151 are identical to those of FIGS. 1, 2a, 2b, and 2c, in this embodiment.

A hole spacer layer is conformally formed on the entire surface of the semiconductor substrate 100, and the hole spacer layer is anisotropically etched to form a hole spacer 155 on the sidewall of the first and second electrode holes 150 and 151.

Next, a first conductive layer is formed over the semiconductor substrate 100 having the hole spacer 155 to fill the first and second electrodes 150 and 151. Then, the first conductive layer is planarized until the mold insulating layer 145 is exposed to form the first and second plug electrode 160 and 161. The first and second plug electrodes 160 and 161 fill the first and second electrode holes 150 and 151, respectively. Due to the hole spacer 155, an alignment margin between the first plug electrode 160 and the PN diode 135 can be increased or obtained. Additionally, the width of the first plug electrode 160 can be realized smaller than the minimum line width defined by a photolithography process. Since a conductive material used as the first and second plug electrodes 160 and 161 are described with reference to FIGS. 1, 2a, 2b, and 2c, its description will be omitted for conciseness.

Referring to FIGS. 5a and 5b, a phase change layer and a capping insulating layer are sequentially formed over the entire surface of the semiconductor substrate 100. The capping insulating layer and the phase change layer are patterned to form the sequentially stacked phase change pattern 165 and the capping insulating pattern 170. The phase change pattern 165 contacts the top of the first plug electrode 165 and a first portion in the top of the second plug electrode 161. The phase change pattern 165 linearly extends along the second direction.

Then, an insulating spacer 175 is formed on the sidewalls of the phase change pattern 165 and the capping insulating pattern 170 is formed on the top of the phase change pattern and also serves as an insultator. A top insulating layer 180 is formed over the entire surface of the semiconductor substrate 100, including over the insulating spacer 175 and the capping insulating pattern 170.

The third layer 144 of the mold insulating layer 145 has an etch selectivity with respect to the top insulating layer 180. The top insulating layer 180 is patterned to form an interconnection contact hole 185 that exposes a second portion in the top of the second plug electrode 161. The interconnection contact hole 185 is formed to be self-aligned to the insulating spacer 175. Additionally, while forming the interconnection contact hole 185, the third layer 144 of the mold insulating layer 145 can be used as an etch stop layer.

The second conductive layer filling the interconnection contact hole 185 is formed over the semiconductor substrate 100, including the top insulating layer 180, and then is planarized until the top insulating layer 180 is exposed to from an interconnection-plug 190.

Next, the interconnection 195 illustrated in FIGS. 1, 2b, and 2c is formed on the top insulating layer 180. Therefore, the phase change memory device illustrated in FIGS. 1, 2a, 2b, and 2c can be realized.

Next, a phase change memory device according to another embodiment of the present invention will be described. Characteristic of the present invention is an arrangement of spaced dopant doped lines and an arrangement of the second plug electrodes connected to the interconnection. Like reference numerals of items common to the previously described embodiment of a phase change memory device are used in the drawings associated with this embodiment.

Figure 6:
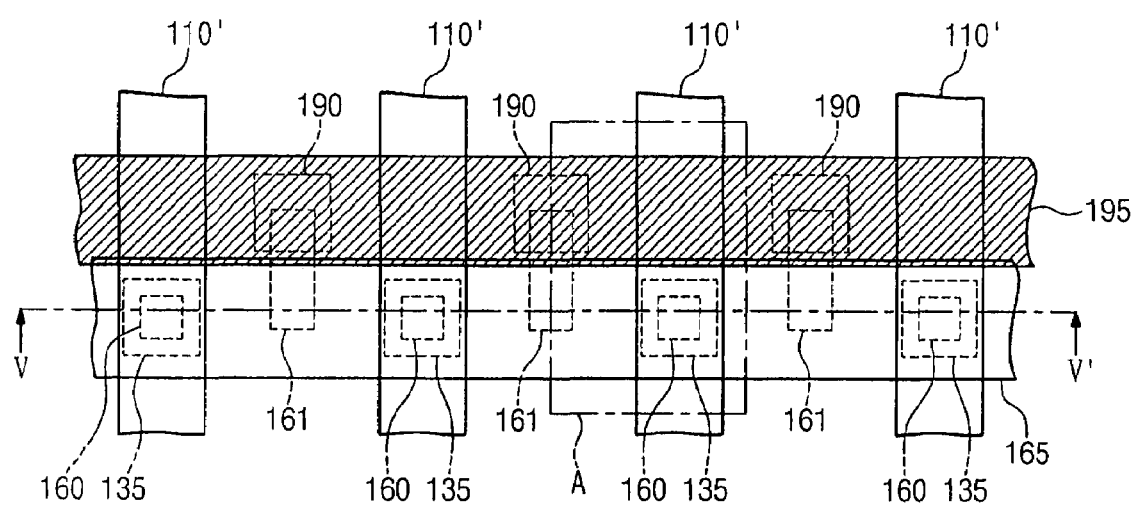
FIG. 6 is a plan view of another embodiment of a phase change memory device according to another aspect of the present invention.
Figure 7:
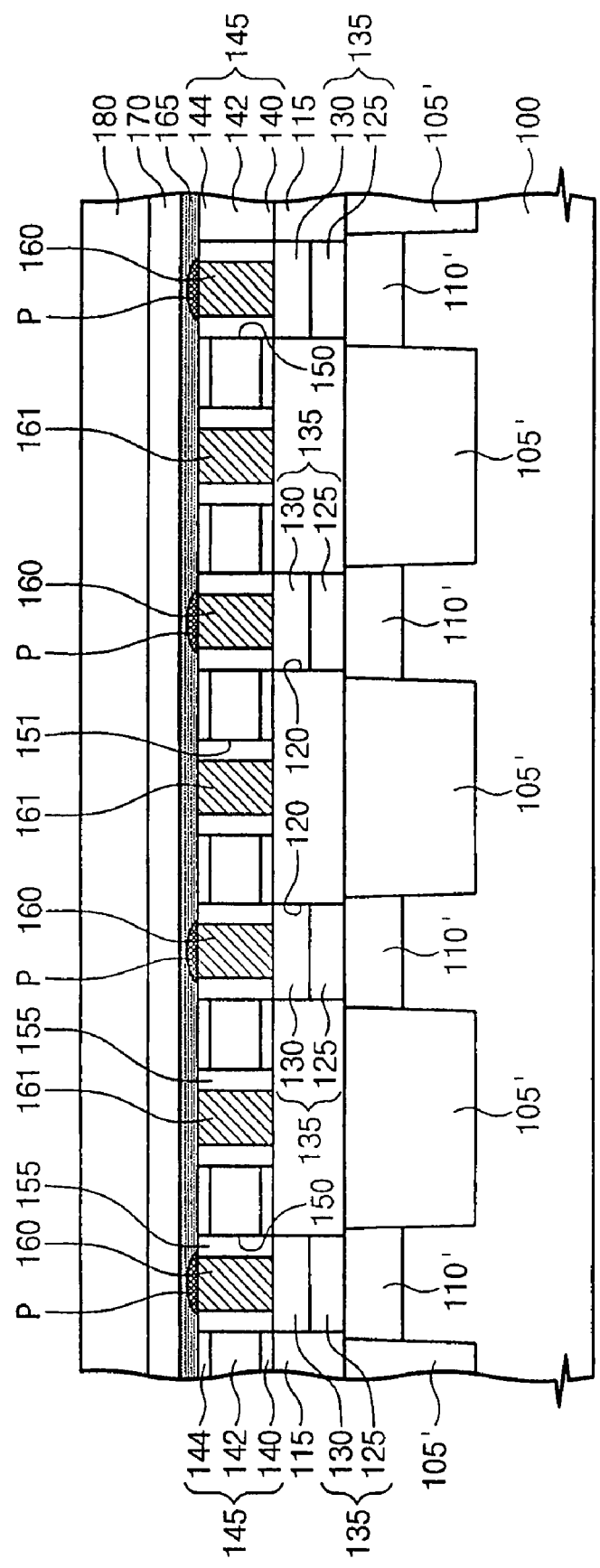
FIG. 7 is a sectional view taken along line V-V' of the device of FIG. 6.

FIG. 6 is a plan view of an embodiment of a phase change memory device according to another aspect of the present invention. FIG. 7 is a sectional view taken along line V-V' of FIG. 6.

Referring to FIGS. 6 and 7, a device isolation layer 105' is disposed on the semiconductor substrate 100 to define a plurality of active regions. The active regions are arranged along a first direction. The device isolation layer 105' can be arranged with substantially equal intervals therebetween. And the active regions are arranged with substantially equal intervals therebetween. The active regions are doped with a first conductive type dopant. Dopant doped lines 110' doped with a second conductive type dopant are formed on the active regions, respectively. Accordingly, the dopant doped lines 110' are arranged with substantially equal intervals therebetween. Consequently, a plurality of PN diodes 135 and first plug electrodes 160 on the dopant doped lines 110' are arranged with substantially equal intervals therebetween.

The phase change pattern 165 crosses over the dopant doped lines 110' along the second direction, which is perpendicular to the first direction. The PN diode 135 and the first plug electrode 160 are sequentially stacked between the phase change pattern 165 and the dopant doped line 110'. The first plug electrode 160 contacts the bottom of the phase change pattern 165. A second plug electrode 161 is disposed over the device isolation layer 105' between a pair of adjacent dopant doped lines 110'. The phase change pattern 165 contacts a first portion in the top of the second plug electrode 161. The second plug electrode 161 is disposed on the bottom insulating layer 115, and the bottom insulating layer 115 covers the semiconductor substrate 100 around the PN diode 135. The first and second plug electrodes 160 and 161 are disposed in the insulating layer 145. The second plug electrodes 161 are arranged on the semiconductor substrate 100 along the second direction. The relationship of the second portion in the top of the second plug electrode 161 and the interconnection-plug 190 can be identical to that of the first embodiment. The phase change pattern 165 is surrounded by the capping insulating pattern 170 and the insulating spacer 175.

The second plug electrode 161 is disposed between a pair of adjacent first plug electrodes 160. The pair of adjacent first plug electrodes 160 is included in the pair of the unit cells, respectively. The pair of unit cells shares the second plug electrode 161 between the pair of adjacent first plug electrodes 160.

Referring to FIG. 6, a reference symbol A represents one unit cell. The phase change memory device of the embodiment includes the unit cell A that can be symmetrically arranged along the second direction. The dopant doped lines 110' are arranged with substantially equal intervals therebetween, and the second plug electrodes 161 are arranged with substantially equal intervals therebetween. According to the phase change memory device of the present embodiment, a pair of adjacent unit cells shares the second plug electrode 161 therebetween, and a pair of adjacent second plug electrodes 161 is shared by the unit cell disposed between the pair of adjacent second plug electrodes 161.

As illustrated above, the phase change memory device of this embodiment is substantially similar to that of the previous embodiment. Furthermore, according to the phase change memory device of the embodiment, the dopant doped lines 110', the device isolation layer 105', the first plug electrodes 160, and the second plug electrodes 161 are arranged with substantially equal intervals therebetween. Accordingly, a photolithography process can be stably performed to realize the phase change memory device. Consequently, a process of manufacturing the phase change memory device becomes easy, such that productivity can be improved.

Unmentioned components in this embodiment can be identical to those of the previous embodiment having the same reference number. The method of forming the phase change memory device illustrated in FIGS. 6 and 7 is substantially the same as that of FIGS. 3a, 4a, and 5a, and 3b, 4b, and 5b.

As described above, the two terminals connected to the phase change pattern contact the bottom of the phase change pattern. Accordingly, the conductive material does not contact the top of the phase change pattern. Consequently, the character deterioration of a phase change material, which is caused by a typical metal pattern, can be prevented. Consequently, the volume of the program region P can be reduced by maintaining the thin thickness of the phase change pattern 165. Therefore, power consumption of the phase change memory device can be reduced and the high degree of integration can be achieved.

Additionally, since an insulating material, such as the capping insulating pattern, is stacked on the phase change pattern, heat loss occurring during erase and write operations can be minimized. Consequently, power consumption of the phase change memory device can be furthermore reduced.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A phase change memory device comprising:
   a mold insulating layer formed on a semiconductor substrate;
   a first plug electrode and a second plug electrode disposed in the mold insulation layer and spaced apart from each other;
   a phase change pattern disposed on the mold insulating layer and contacting a top of the first plug electrode and a first portion of a top of the second plug electrode;
   a top insulating layer covering an entire surface of the semiconductor substrate;
   an interconnection-plug penetrating the top insulating layer to connect to a second portion of the top of the second plug electrode, wherein the phase change pattern is not in contact with the second portion of the top of the second plug electrode; and
   an interconnection disposed on the top insulating layer and connected to the interconnection-plug.

2. The device of claim 1, wherein a contact area between the second plug electrode and the phase change pattern is broader than a contact area between the first plug electrode and the phase change pattern, and a program region comprises a portion of the phase change pattern that contacts the first plug electrode.

3. The device of claim 1, further comprising:
   a capping insulating pattern disposed on the phase change pattern; and
   an insulating spacer formed on sidewalls of the capping insulating pattern and the phase change pattern.

4. The device of claim 3, wherein the interconnection-plug contacts the insulating spacer.

5. The device of claim 1, wherein the phase change pattern has a linear form that extends in one direction, and the interconnection extends along the one direction such that it is parallel to the phase change pattern.

6. The device of claim 1, wherein a bottom of the first plug electrode is connected to a switching device disposed below the mold insulating layer, and an entire bottom of the second plug electrode contacts an insulating material.

7. A phase change memory device comprising:
   a mold insulating layer formed on a semiconductor substrate;
   a first plug electrode and a second plug electrode disposed in the mold insulation layer and spaced apart from each other;
   a phase change pattern disposed on the mold insulating layer and contacting a top of the first plug electrode and a first portion of a top of the second plug electrode;
   a top insulating layer covering an entire surface of the semiconductor substrate;
   an interconnection-plug penetrating the top insulating layer to connect to a second portion of the top of the second plug electrode;
   an interconnection disposed on the top insulating layer and connected to the interconnection-plug;
   a dopant doped line formed at an active region that is formed on the semiconductor substrate;
   a bottom insulating layer disposed over the entire surface of the semiconductor substrate; and
   a PN diode filling an opening, the opening penetrating the bottom insulating layer to expose the dopant doped line, wherein a bottom of the first plug electrode contacts a top of the PN diode, and a bottom of the second plug electrode contacts the bottom insulating layer.

8. The device of claim 7, wherein the phase change pattern and the interconnection cross over the dopant doped line side-by-side.

9. The device of claim 1, further comprises a hole spacer interposed between the first plug electrode and a sidewall of a first electrode hole, and between the second plug electrode and a sidewall of a second electrode hole,
   wherein the first and second plug electrodes are disposed in the first and second electrode holes, respectively, and the first and second electrode holes penetrate the mold insulating layer.

10. The device of claim 1, wherein the interconnection-plug is in contact with the second portion of the top of the second plug electrode.

11. A phase change memory device comprising:
    a mold insulating layer formed on a semiconductor substrate;
    a pair of first plug electrodes spaced apart from each other in the mold insulating layer;
    a second plug electrode disposed in the mold insulating layer, at least a portion of the second plug electrode disposed between the pair of first plug electrodes;
    a phase change pattern disposed on the mold insulating layer and contacting tops of the pair of first plug electrodes and a first portion of a top of the second plug electrode;
    a top insulating layer disposed over an entire surface of the semiconductor substrate;
    an interconnection-plug penetrating the top insulating layer to connect to a second portion of the top of the second plug electrode, wherein the phase change pattern is not in contact with the second portion of the top of the second plug electrode; and
    an interconnection disposed on the top insulating layer and connected to the interconnection-plug.

12. The device of claim 11, wherein a contact area between the second plug electrode and the phase change pattern is broader than a contact area between a first plug electrode from the pair of first plug electrodes and the phase change pattern, and a program region comprises a portion of the phase change pattern, which contacts the first plug electrode.

13. The device of claim 11, further comprising:
    a capping insulating pattern disposed on the phase change pattern; and
    an insulating spacer formed on sidewalls of the capping insulating pattern and the phase change pattern.

14. The device of claim 11, wherein a bottom of the first plug electrode is connected to a switching device disposed below the mold insulating layer, and an entire bottom of the second plug electrode contacts an insulating material.

15. A phase change memory device comprising:
    a mold insulating layer formed on a semiconductor substrate;
    a pair of first plug electrodes spaced apart from each other in the mold insulating layer;
    a second plug electrode disposed in the mold insulating layer, at least a portion of the second plug electrode disposed between the pair of first plug electrodes;
    a phase change pattern disposed on the mold insulating layer and contacting tops of the pair of first plug electrodes and a first portion of a top of the second plug electrode;
    a top insulating layer disposed over an entire surface of the semiconductor substrate;
    an interconnection-plug penetrating the top insulating layer to connect to a second portion of the top of the second plug electrode; and an interconnection disposed on the top insulating layer and connected to the interconnection-plug;
a dopant doped line formed at an active region that is formed on the semiconductor substrate;
a bottom insulating layer on the entire surface of the semiconductor substrate; and
a PN diode filling an opening, the opening penetrating the bottom insulating layer to expose the dopant doped line,
wherein the bottom of the first plug electrode contacts a top of the PN diode;
a bottom of the second plug electrode contacts the bottom insulating layer; and
the phase change pattern and the interconnection cross over the dopant doped line side-by-side.

16. The device of claim 11, wherein the pair of first plug electrodes are included in a pair of unit cells, respectively, wherein the pair of unit cells shares the second plug electrode and the pair of unit cells is arranged along one direction.

17. The device of claim 11, wherein the device comprises a plurality of pairs of first plug electrodes arranged along one direction, a plurality of the second electrodes arranged along the one direction, wherein the first electrodes are arranged with substantially equal intervals therebetween, and a portion of each of the second electrodes is disposed between adjacent first electrodes.

18. The device of claim 11, wherein the interconnection-plug is in contact with the second portion of the top of the second plug electrode.

19. A method of forming a phase change memory device, the method comprising:
forming a mold insulating layer on a semiconductor substrate;
forming a first plug electrode and a second plug electrode spaced apart from each other in the mold insulating layer;
forming a phase change pattern on the mold insulating layer, the phase change pattern contacting a top of the first plug electrode and a first portion of a top of the second plug electrode;
forming a top insulating layer covering the semiconductor substrate;
forming an interconnection-plug penetrating the top insulating layer to connect to a second portion of the top of the second plug electrode, wherein the phase change pattern is not in contact with the second portion of the top of the second plug electrode; and
forming an interconnection disposed on the top insulating layer, the interconnection connected to the interconnection-plug.

20. The method of claim 19, wherein a contact area between the second plug electrode and the phase change pattern is broader than a contact area between the first plug electrode and the phase change pattern, and a program region comprises a portion of the phase change pattern that contacts the first plug electrode.

21. The method of claim 19, further comprising, before the forming of the top insulating layer:
forming a capping insulating pattern on the phase change pattern; and
forming an insulating spacer on sidewalls of the capping insulating pattern and the phase change pattern.

22. The method of claim 21, wherein forming the interconnection-plug includes self-aligning the interconnection-plug to the insulating spacer.

23. The method of claim 19, further comprising, before the forming of the mold insulating layer:
forming a switching device on the semiconductor substrate, including connecting a bottom of the first plug electrode to the switching device below the mold insulating layer, and contacting an entire bottom of the second plug electrode to an insulating material.

24. A method of forming a phase change memory device comprising:
forming a mold insulating layer on a semiconductor substrate;
forming a first plug electrode and a second plug electrode spaced apart from each other in the mold insulating layer;
forming a phase change pattern on the mold insulating layer, the phase change pattern contacting a top of the first plug electrode and a first portion of a top of the second plug electrode;
forming a top insulating layer covering the semiconductor substrate;
forming an interconnection-plug penetrating the top insulating layer to connect to a second portion of the top of the second plug electrode;
forming an interconnection disposed on the top insulating layer, the interconnection connected to the interconnection-plug;
forming a device isolation layer to define an active region on the semiconductor substrate;
forming a dopant doped line at the active region;
forming a bottom insulating on the semiconductor substrate;
patterning the bottom insulating layer to form an opening that exposes the dopant doped line; and
forming a PN diode that fills the opening,
wherein the bottom of the first plug electrode contacts a top of the PN diode;
the bottom of the second plug electrode contacts the bottom insulating layer; and
the interconnection and the phase change pattern crosses over the dopant doped line.

25. The method of claim 24, wherein at least a lower portion of the mold insulating layer has an etch selectivity with respect to the bottom insulating layer.

26. The method of claim 19, wherein the forming of the first and second plug electrodes comprises:
patterning the mold insulating layer to form a first electrode hole and a second electrode hole that are spaced apart from each other;
forming a hole spacer on sidewalls of the first and second electrode holes;
forming a conductive layer to fill the first and second electrode holes having the hole spacer; and
planarizing the conductive layer, until the mold insulating layer is exposed, to form the first and second plug electrodes.

27. The method of claim 19, wherein at least an upper portion of the mold insulating layer has an etch selectivity with respect to the top insulating layer.

* * * * *